(12) United States Patent
Rogers

(10) Patent No.: US 11,938,628 B2
(45) Date of Patent: Mar. 26, 2024

(54) SYSTEMS AND METHODS FOR CONTROLLING MOVEMENTS OF ROBOTIC ACTUATORS

(71) Applicant: Boston Dynamics, Inc., Waltham, MA (US)

(72) Inventor: Kyle Rogers, Carlisle, MA (US)

(73) Assignee: Boston Dynamics, Inc., Waltham, MA (US)

( * ) Notice: Subject to any disclaimer, the term of this patent is extended or adjusted under 35 U.S.C. 154(b) by 114 days.

(21) Appl. No.: 17/530,712

(22) Filed: Nov. 19, 2021

(65) Prior Publication Data

US 2023/0158666 A1 May 25, 2023

(51) Int. Cl.
| | | |
|---|---|---|
| *B25J 5/00* | (2006.01) | |
| *B25J 9/12* | (2006.01) | |
| *G05F 1/10* | (2006.01) | |
| *H02P 3/22* | (2006.01) | |
| *H03K 17/56* | (2006.01) | |

(52) U.S. Cl.
CPC ..................... *B25J 9/12* (2013.01);
*G05F 1/10* (2013.01); *H02P 3/22* (2013.01);
*H03K 17/56* (2013.01)

(58) Field of Classification Search
CPC ..... H02P 3/22; H02P 3/12; H02P 6/24; H03K 17/56; B25J 9/12
See application file for complete search history.

(56) References Cited

U.S. PATENT DOCUMENTS

| | | |
|---|---|---|
| 9,114,536 B2 | 8/2015 | Sussman |
| 9,975,729 B2 | 9/2018 | Rogers et al. |
| 2012/0281444 A1 | 11/2012 | Dent |

FOREIGN PATENT DOCUMENTS

WO    WO-2021151667 A1 *    8/2021    ............ B25J 9/0048

OTHER PUBLICATIONS

International Search Report and Written Opinion of the International Searching Authority for International Application No. PCT/US2022/048599 dated Feb. 16, 2023.

* cited by examiner

*Primary Examiner* — Karen Masih
(74) *Attorney, Agent, or Firm* — Knobbe, Martens, Olson & Bear, LLP

(57) ABSTRACT

An electronic circuit comprises a charge storing component, a set of one or more switching components coupled to the charge storing component, and an additional switching component coupled to each of the one or more switching components in the set. The additional switching component is configured to operate in a first state or a second state based on a received current or voltage. The first state prevents current to flow from the charge storing component to each of the one or more switching components in the set and the second state allows current to flow from the charge storing component to each of the one or more switching components in the set.

22 Claims, 7 Drawing Sheets

600

602 Storing electric charge in a charge storing component of an electronic circuit, the charge storing component coupled to a current flow regulating component and a set of one or more switching components.

604 Operating an additional switching component in a first state or a second state based on a current or voltage received by the additional switching component, the first state preventing current to flow from the charge storing component to each switching component in the set of one or more switching components and the second state allowing current to flow from the charge storing component to each of the one or more switching components in the set.

FIG. 6

SYSTEMS AND METHODS FOR CONTROLLING MOVEMENTS OF ROBOTIC ACTUATORS

TECHNICAL FIELD

This disclosure relates generally to robotics and more specifically to controlling movements of robotic actuators.

BACKGROUND

A robot is generally defined as a reprogrammable and multifunctional manipulator designed to move material, parts, tools, and/or specialized devices through variable programmed motions to perform one or more tasks. Robots may be manipulators that are physically anchored (e.g., industrial robotic arms), mobile platforms that move throughout an environment (e.g., using legs, wheels, or traction-based mechanisms), or some combination of one or more manipulators and/or one or more mobile platforms. Robots are utilized in a variety of industries including, for example, manufacturing, warehouse logistics, transportation, hazardous environments, exploration, and healthcare.

SUMMARY

Some embodiments herein include systems and methods for controlling (e.g., passively damping) movements of robotic actuators (and/or any coupled motors or joints). During operation, a robot may experience an event that causes it to lose control of its joints (e.g., a power loss or an emergency stop) and therefore creates a risk of hazard (e.g., the robot suddenly crashing to the ground). Some embodiments herein mitigate this risk by providing a novel form of shorting one or more motors powering one or more actuators and/or joints of the robot. For example, certain windings of the motor(s) can be shorted using an electronic circuit that provides locally stored charge upon a loss of primary power to the motor(s), e.g., passively or with no further action required.

In some embodiments, an electronic circuit can hold charge in a charge storing component (e.g., a capacitor bank or a battery) during operation. If the circuit loses primary power, charge from the charge storing component can automatically flow to a set of one or more switching devices, which can in turn short certain windings of the motor(s) moving the actuator(s) and/or joint(s) of the robot. In this manner, passive damping and/or braking can be provided using no physical brakes or additional control systems, and requiring no additional voltage regulation. Such a passive implementation can enable simpler, safer and more effective stopping of the robot. In addition, in some embodiments the circuit can fit in the form factor of the actuator itself, economizing on space and/or mass used in the robot.

In one aspect, the invention features an electronic circuit. The electronic circuit includes a charge storing component. The electronic circuit also includes a set of one or more switching components coupled to the charge storing component. The electronic circuit also includes an additional switching component coupled to the set of one or more switching components. The additional switching component is configured to operate in a first state or a second state based on a received current or voltage, the first state preventing current to flow from the charge storing component to each of the one or more switching components in the set and the second state allowing current to flow from the charge storing component to each of the one or more switching components in the set.

In some embodiments, the electronic circuitry includes a current flow regulating component coupled to the charge storing component. In some embodiments, the electronic circuit includes a motor having a plurality of motor windings. In some embodiments, each switching component in the set of one or more switching components is coupled to a distinct motor winding in the plurality of motor windings. In some embodiments, when each switching component in the set of one or more switching components assumes a closed state, each motor winding in the plurality of motor windings is shorted. In some embodiments, the motor is operably connected to a robot joint. In some embodiments, the circuit and the motor are both mounted in or near a robot joint. In some embodiments, the motor includes at least one of a brushless direct current motor or a permanent magnet synchronous motor.

In some embodiments, the additional switching component is coupled to a primary power bus for a set of motors of a robot. In some embodiments, each switching component in the set of one or more switching components is coupled to a common gate. In some embodiments, each switching component in the set of one or more switching components is coupled to a distinct gate. In some embodiments, the charge storing component includes one or more capacitors. In some embodiments, the charge storing component includes a battery. In some embodiments, the one or more capacitors have a total capacitance of 10 to 1000 microfarads (e.g., 20-500 µF, optionally 50-100 µF).

In some embodiments, the current flow regulating component includes a diode. In some embodiments, the diode includes at least one of a Schottky diode, a low reverse leakage diode or a silicon diode. In some embodiments, the additional switching component includes a solid-state relay. In some embodiments, the set of switching components includes one or more MOSFETs. In some embodiments, the one or more MOSFETs are n-channel MOSFETs. In some embodiments, the electronic circuit includes a resistor coupled to the charge storing component. In some embodiments, the resistor is located between the charge storing component and the set of one or more switching components.

In some embodiments, the electronic circuit includes a common power source coupled to the set of one or more switching components and the additional switching component. In some embodiments, during operation, when the common power source is providing power to the circuit, each switching component in the set of switching components is open and the additional switching component is closed. In some embodiments, during operation, when the common power source is not providing power to the circuit, each switching component in the set of switching components is closed and the additional switching component is open. In some embodiments, the common power source is a direct current power source. In some embodiments, the common power source provides between 2 and 20 Volts of electrical potential (e.g., 3-18V, optionally 12V). In some embodiments, when the common power source loses power, the charge storing component provides power passively to the set of one or more switching components. In some embodiments, the second state is triggered by an applied current falling below a threshold value (e.g., in the range of 0.5-5 mA). In some embodiments, the additional switching component is configured to determine that the circuit has lost power and passively provide power from the charge storing component to the set of one or more switching components in response to determining that the circuit has lost power In another aspect, the invention features a method. The method includes storing electric charge in a charge storing component of an electronic circuit. The charge storing component is coupled to a current flow regulating component. The method also includes operating an additional switching component in a first state or a second state based on a current or voltage received by the additional switching component. The first state prevents current to flow from the charge storing component to each switching component in the set of one or more switching components and the second state allows current to flow from the charge storing component to each of the one or more switching components in the set.

In some embodiments, each switching component in the set of one or more switching components is coupled to a distinct motor winding of a motor having a plurality of motor windings. In some embodiments, when each switching component in the set of one or more switching components assumes a closed state, each motor winding in the plurality of motor windings is shorted. In some embodiments, the motor is operably connected to a robot joint. In some embodiments, the circuit and the motor are both mounted in or near a robot joint. In some embodiments, the motor includes at least one of a brushless direct current motor or a permanent magnet synchronous motor. In some embodiments, the additional switching component is coupled to a primary power bus for a set of motors of a robot. In some embodiments, each switching component in the set of one or more switching components is coupled to a common gate. In some embodiments, each switching component in the set of one or more switching components is coupled to a distinct gate.

In some embodiments, the charge storing component includes one or more capacitors. In some embodiments, the charge storing component includes a battery. In some embodiments, the one or more capacitors have a total capacitance of 10 to 1000 microfarads (e.g., 20-500 µF, optionally 50-100 µF). In some embodiments, the current flow regulating component includes a diode. In some embodiments, the diode includes at least one of a Schottky diode, a low reverse leakage diode or a silicon diode. In some embodiments, the additional switching component includes a solid-state relay. In some embodiments, the set of switching components includes one or more MOSFETs. In some embodiments, the one or more MOSFETs are n-channel MOSFETs. In some embodiments, a resistor is coupled to the charge storing component. In some embodiments, the resistor is located between the charge storing component and the set of one or more switching components.

In some embodiments, a common power source is coupled to the set of one or more switching components and the additional switching component. In some embodiments, during operation, when the common power source is providing power to the circuit, each switching component in the set of switching components is open and the additional switching component is closed. In some embodiments, during operation, when the common power source is not providing power to the circuit, each switching component in the set of switching components is closed and the additional switching component is open. In some embodiments, the common power source is a direct current power source. In some embodiments, the common power source provides between 2 and 20 Volts of electrical potential (e.g., 3-18V, optionally 12V). In some embodiments, when the common power source loses power, the charge storing component provides power passively to the set of one or more switching components. In some embodiments, the second state is triggered by an applied current falling below a threshold value (e.g., in the range of 0.5-5 mA).

In another aspect, the invention features a mobile robot. The mobile robot includes a plurality of robot joints, each being associated with a motor. The mobile robot further includes at least one electronic circuit coupled to each of the plurality of robot joints. The at least one electronic circuit includes a charge storing component, a set of one or more switching components coupled to the motor of at least one of the plurality of robot joints, and an additional switching component coupled to each of the one or more switching components in the set. The additional switching component is configured to operate in a first state or a second state based on a received current or voltage, the first state preventing current to flow from the charge storing component to each of the one or more switching components in the set and the second state allowing current to flow from the charge storing component to each of the one or more switching components in the set.

In some embodiments, the mobile robot further includes a power bus configured to provide power to one or more of the plurality of robot joints, and the set of one or more switching components is coupled to the motor of the at least one of the plurality or robot joints via the power bus. In some embodiments, the at least one electronic circuit further includes a current flow regulating component coupled to the charge storing component and a resistor coupled between the charge storing component and the set of one or more switching components.

BRIEF DESCRIPTION OF DRAWINGS

The advantages of the invention, together with further advantages, may be better understood by referring to the following description taken in conjunction with the accompanying drawings. The drawings are not necessarily to scale, and emphasis is instead generally placed upon illustrating the principles of the invention.

FIG. 6 is a flowchart of an exemplary method, according to an illustrative embodiment.

DETAILED DESCRIPTION

An example implementation involves a robotic device configured with at least one robotic limb, one or more sensors, and a processing system. The robotic limb may be an articulated robotic appendage including a number of members connected by joints. The robotic limb may also include a number of actuators (e.g., 2-5 actuators) coupled to the members of the limb that facilitate movement of the robotic limb through a range of motion limited by the joints connecting the members. The sensor(s) may be configured to measure one or more properties of the robotic device, such as angles of the joints, pressures within the actuators, joint torques, and/or positions, velocities, and/or accelerations of members of the robotic limb(s) at a given point in time. The sensor(s) may additionally or alternatively be configured to measure an orientation (e.g., a body orientation measurement) of the body of the robotic device (which may also be referred to herein as the "base" of the robotic device). Other example properties include the masses of various components of the robotic device, among other properties. The processing system of the robotic device may be configured to determine motions or other parameters of the robotic device, e.g., the angles of the joints of the robotic limb, either directly from angle sensor information or indirectly from other sensor information from which the joint angles can be calculated.

Figure 1:
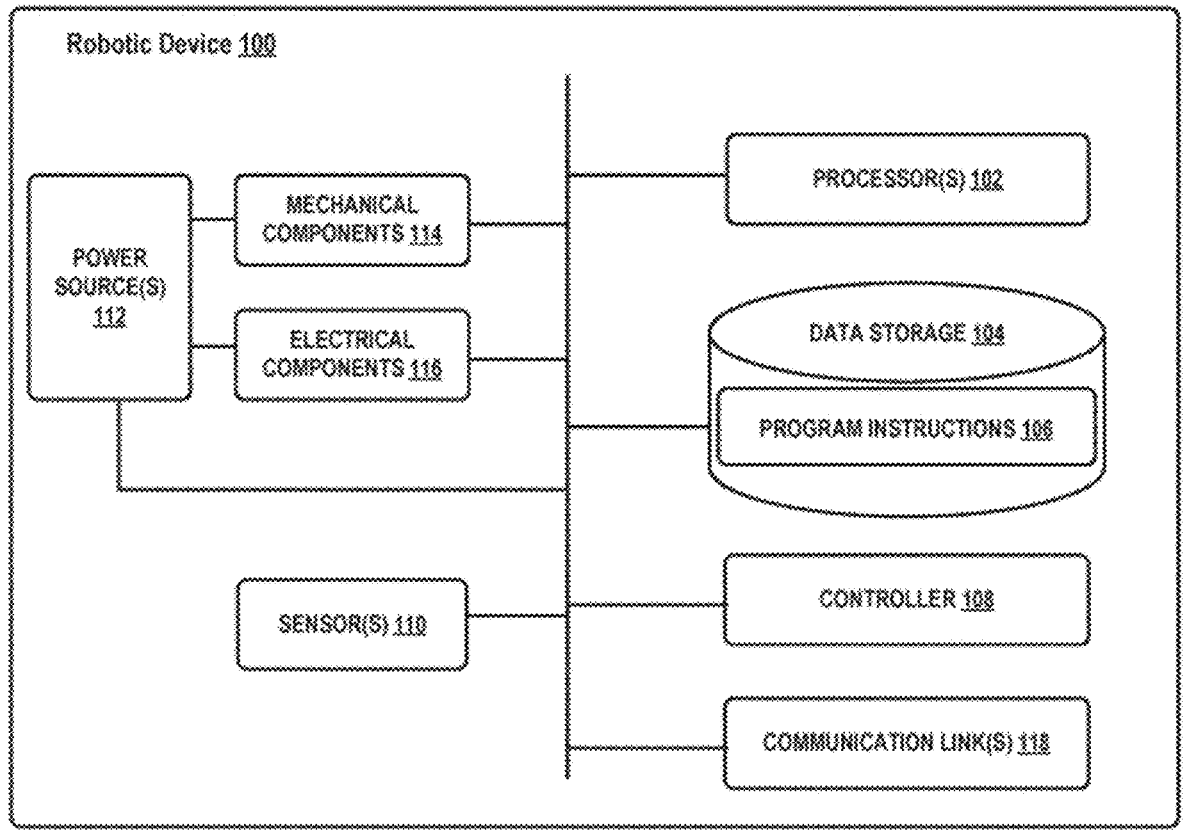
FIG. 1 illustrates an example configuration of a robotic device, according to an illustrative embodiment.

FIG. 1 illustrates an example configuration of a robotic device (or "robot") 100, according to an illustrative embodiment. The robotic device 100 represents an example robotic device configured to perform the operations described herein. Additionally, the robotic device 100 may be configured to operate autonomously, semi-autonomously, and/or using directions provided by user(s), and may exist in various forms, such as a humanoid robot, biped, quadruped, or other mobile robot, among other examples. Furthermore, the robotic device 100 may also be referred to as a robotic system, mobile robot, or robot, among other designations.

As shown in FIG. 1, the robotic device 100 includes processor(s) 102, data storage 104, program instructions 106, controller 108, sensor(s) 110, power source(s) 112, mechanical components 114, and electrical components 116. The robotic device 100 is shown for illustration purposes and may include more or fewer components without departing from the scope of the disclosure herein. The various components of robotic device 100 may be connected in any manner, including via electronic communication means, e.g., wired or wireless connections. Further, in some examples, components of the robotic device 100 may be positioned on multiple distinct physical entities rather on a single physical entity. Other example illustrations of robotic device 100 may exist as well.

Processor(s) 102 may operate as one or more general-purpose processor or special purpose processors (e.g., digital signal processors, application specific integrated circuits, field programmable gate arrays, etc.). The processor(s) 102 can be configured to execute computer-readable program instructions 106 that are stored in the data storage 104 and are executable to provide the operations of the robotic device 100 described herein. For instance, the program instructions 106 may be executable to provide operations of controller 108, where the controller 108 may be configured to cause activation and/or deactivation of the mechanical components 114 and the electrical components 116. The processor(s) 102 may operate and enable the robotic device 100 to perform various functions, including the functions described herein.

The data storage 104 may exist as various types of storage media, such as a memory. For example, the data storage 104 may include or take the form of one or more computer-readable storage media that can be read or accessed by processor(s) 102. The one or more computer-readable storage media can include volatile and/or non-volatile storage components, such as optical, magnetic, organic or other memory or disc storage, which can be integrated in whole or in part with processor(s) 102. In some implementations, the data storage 104 can be implemented using a single physical device (e.g., one optical, magnetic, organic or other memory or disc storage unit), while in other implementations, the data storage 104 can be implemented using two or more physical devices, which may communicate electronically (e.g., via wired or wireless communication). Further, in addition to the computer-readable program instructions 106, the data storage 104 may include additional data such as diagnostic data, among other possibilities.

The robotic device 100 may include at least one controller 108, which may interface with the robotic device 100. The controller 108 may serve as a link between portions of the robotic device 100, such as a link between mechanical components 114 and/or electrical components 116. In some instances, the controller 108 may serve as an interface between the robotic device 100 and another computing device. Furthermore, the controller 108 may serve as an interface between the robotic system 100 and a user(s). The controller 108 may include various components for communicating with the robotic device 100, including one or more joysticks or buttons, among other features. The controller 108 may perform other operations for the robotic device 100 as well. Other examples of controllers may exist as well.

Additionally, the robotic device 100 includes one or more sensor(s) 110 such as force sensors, proximity sensors, motion sensors, load sensors, position sensors, touch sensors, depth sensors, ultrasonic range sensors, and/or infrared sensors, among other possibilities. The sensor(s) 110 may provide sensor data to the processor(s) 102 to allow for appropriate interaction of the robotic system 100 with the environment as well as monitoring of operation of the systems of the robotic device 100. The sensor data may be used in evaluation of various factors for activation and deactivation of mechanical components 114 and electrical components 116 by controller 108 and/or a computing system of the robotic device 100.

The sensor(s) 110 may provide information indicative of the environment of the robotic device for the controller 108 and/or computing system to use to determine operations for the robotic device 100. For example, the sensor(s) 110 may capture data corresponding to the terrain of the environment or location of nearby objects, which may assist with environment recognition and navigation, etc. In an example configuration, the robotic device 100 may include a sensor system that may include a camera, RADAR, LIDAR, time-of-flight camera, global positioning system (GPS) transceiver, and/or other sensors for capturing information of the environment of the robotic device 100. The sensor(s) 110 may monitor the environment in real-time and detect obstacles, elements of the terrain, weather conditions, temperature, and/or other parameters of the environment for the robotic device 100.

Further, the robotic device 100 may include other sensor(s) 110 configured to receive information indicative of the state of the robotic device 100, including sensor(s) 110 that may monitor the state of the various components of the robotic device 100. The sensor(s) 110 may measure activity of systems of the robotic device 100 and receive information based on the operation of the various features of the robotic device 100, such as the operation of extendable legs, arms, or other mechanical and/or electrical features of the robotic device 100. The sensor data provided by the sensors may enable the computing system of the robotic device 100 to determine errors in operation as well as monitor overall functioning of components of the robotic device 100.

For example, the computing system may use sensor data to determine the stability of the robotic device 100 during operations as well as measurements related to power levels, communication activities, components that require repair, among other information. As an example configuration, the robotic device 100 may include gyroscope(s), accelerometer(s), and/or other possible sensors to provide sensor data relating to the state of operation of the robotic device. Further, sensor(s) 110 may also monitor the current state of a function, such as a gait, that the robotic system 100 may currently be operating. Additionally, the sensor(s) 110 may measure a distance between a given robotic leg of a robotic device and a center of mass of the robotic device. Other example uses for the sensor(s) 110 may exist as well.

Additionally, the robotic device 100 may include one or more power source(s) 112 configured to supply power to various components of the robotic device 100. Among possible power systems, the robotic device 100 may include a hydraulic system, electrical system, batteries, and/or other types of power systems. As an example illustration, the robotic device 100 may include one or more batteries configured to provide power to components via a wired and/or wireless connection. Within examples, components of the mechanical components 114 and electrical components 116 may each connect to a different power source or may be powered by the same power source. Components of the robotic system 100 may connect to multiple power sources as well.

Within example configurations, any type of power source may be used to power the robotic device 100, such as a gasoline and/or electric engine. Further, the power source(s) 112 may charge using various types of charging, such as wired connections to an outside power source, wireless charging, combustion, or other examples. Other configurations may also be possible. Additionally, the robotic device 100 may include a hydraulic system configured to provide power to the mechanical components 114 using fluid power. Components of the robotic device 100 may operate based on hydraulic fluid being transmitted throughout the hydraulic system to various hydraulic motors and hydraulic cylinders, for example. The hydraulic system of the robotic device 100 may transfer a large amount of power through small tubes, flexible hoses, or other links between components of the robotic device 100. Other power sources may be included within the robotic device 100 (e.g., electric components, such as electric motors and/or gearboxes may be used in place of or in addition to hydraulic components).

Mechanical components 114 represents hardware of the robotic system 100 that may enable the robotic device 100 to operate and perform physical functions. As a few examples, the robotic device 100 may include actuator(s), extendable leg(s) ("legs"), arm(s), wheel(s), one or multiple structured bodies for housing the computing system or other components, and/or other mechanical components. The mechanical components 114 included as a portion of the robotic device 100 may depend on the design of the robotic device 100 and may also be based on the functions and/or tasks the robotic device 100 may be configured to perform. As such, depending on the operation and functions of the robotic device 100, different mechanical components 114 may be available for the robotic device 100 to utilize. In some examples, the robotic device 100 may be configured to add and/or remove mechanical components 114, which may involve assistance from a user and/or other robotic device. For example, the robotic device 100 may be initially configured with four legs, but may be altered by a user or the robotic device 100 to remove two of the four legs to operate as a biped. Other examples of mechanical components 114 may be included as a portion of robotic device 100.

The electrical components 116 may include various components capable of processing, transferring, and/or providing electrical charge or electric signals to other components of robotic device 100, for example. Among possible examples, the electrical components 116 may include electrical wires, circuitry, and/or wireless communication transmitters and receivers to enable operations of the robotic device 100. The electrical components 116 may interwork with the mechanical components 114 to enable the robotic device 100 to perform various operations. The electrical components 116 may be configured to provide power from the power source(s) 112 to the various mechanical components 114, for example. Further, the robotic device 100 may include electric motors. Other examples of electrical components 116 may exist as well.

In some implementations, the robotic device 100 may also include communication link(s) 118 configured to send and/or receive information. The communication link(s) 118 may transmit data indicating the state of the various components of the robotic device 100. For example, information read in by sensor(s) 110 may be transmitted via the communication link(s) 118 to a separate device. Other diagnostic information indicating the integrity or health of the power source(s) 112, mechanical components 114, electrical components 116, processor(s) 102, data storage 104, and/or controller 108 may be transmitted via the communication link(s) 118 to an external communication device.

In some implementations, the robotic device 100 may receive information at the communication link(s) 118 that is processed by the processor(s) 102. The received information may indicate data that is accessible by the processor(s) 102 during execution of the program instructions 106, for example. Further, the received information may change aspects of the controller 108 that may affect the behavior of the mechanical components 114 or the electrical components 116. In some cases, the received information indicates a query requesting a particular piece of information (e.g., the operational state of one or more of the components of the robotic device 100), and the processor(s) 102 may subsequently transmit that particular piece of information via the communication link(s) 118 to a device that issued the query.

In some cases, the communication link(s) 118 include a wired connection. The robotic device 100 may include one or more ports to interface the communication link(s) 118 to an external device. The communication link(s) 118 may include, in addition to or alternatively to the wired connection, a wireless connection. Some example wireless connections may utilize a cellular connection, such as CDMA, EVDO, GSM/GPRS, or 4G telecommunication, such as WiMAX or LTE. Alternatively or in addition, the wireless connection may utilize a Wi-Fi connection to transmit data to a wireless local area network (WLAN). In some implementations, the wireless connection may also communicate over an infrared link, radio, Bluetooth, or a near-field communication (NFC) device.

Figure 2:
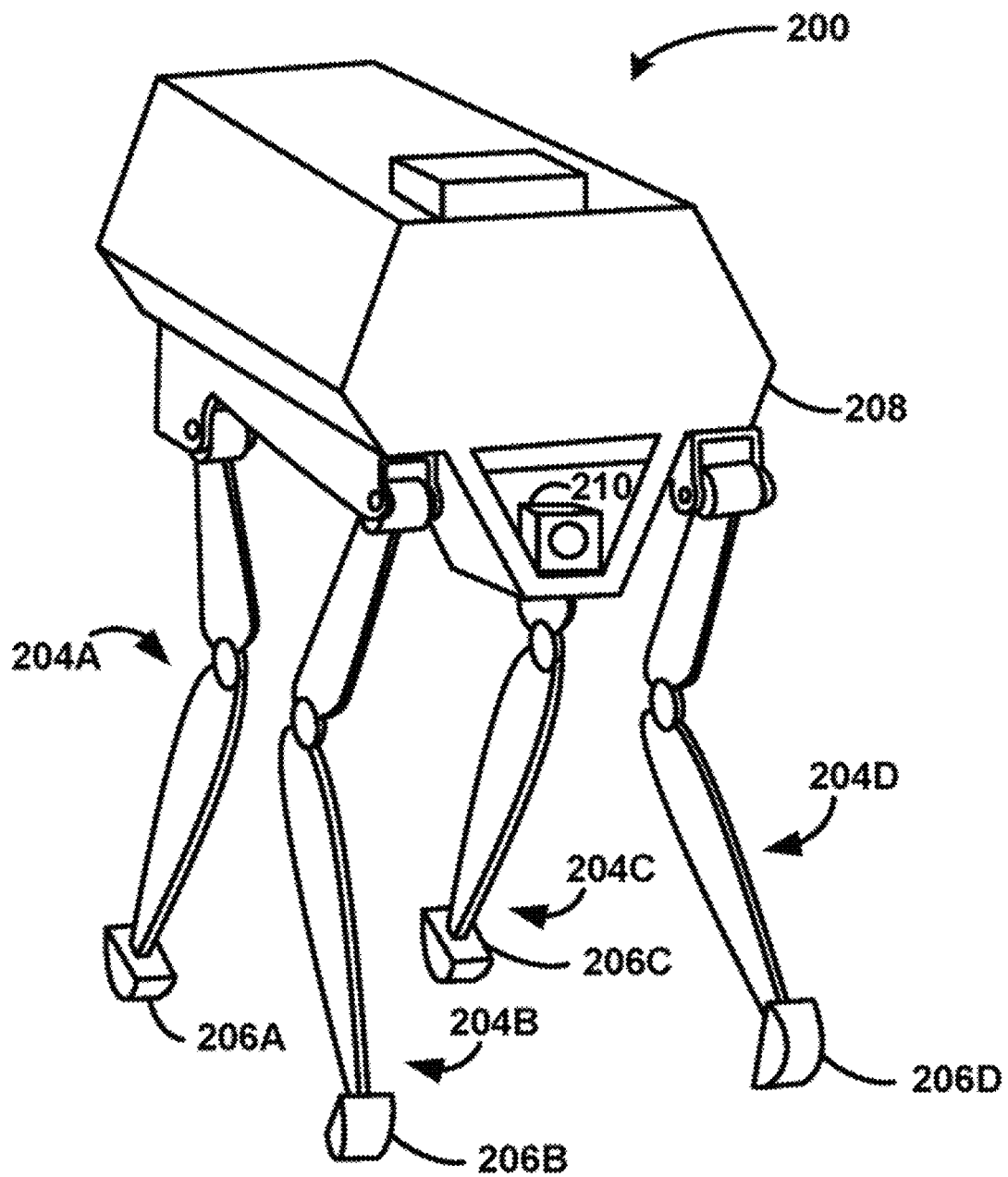
FIG. 2 illustrates a perspective view of a quadruped robot, according to an illustrative embodiment.

FIG. 2 illustrates a quadruped robot 200, according to an example implementation. Among other possible features, the robot 200 may be configured to perform some of the operations described herein. The robot 200 includes a control system, and legs 204A, 204B, 204C, 204D connected to a body 208. Each leg may include a respective foot 206A, 206B, 206C, 206D that may contact a surface (e.g., a ground surface). Further, the robot 200 is illustrated with sensor(s)

210, and may be capable of carrying a load on the body 208. Within other examples, the robot 200 may include more or fewer components, and thus may include components not shown in FIG. 2.

The robot 200 may be a physical representation of the robotic system 100 shown in FIG. 1, or may be based on other configurations. Thus, the robot 200 may include one or more of mechanical components 114, sensor(s) 110, power source(s) 112, electrical components 116, and/or controller 108, described in connection with FIG. 1, among other possible components or systems. In addition, the configuration, position, and/or structure of the legs 204A-204D may vary in example implementations. For example, the legs 204A-204D may enable the robot 200 to move relative to its environment, and may be configured to operate in multiple degrees of freedom to enable different techniques of travel. In particular, the legs 204A-204D may enable the robot 200 to travel at various speeds according to the mechanics set forth within different gaits. The robot 200 may use one or more gaits to travel within an environment, which may involve selecting a gait based on speed, terrain, the need to maneuver, and/or energy efficiency.

The body 208 of the robot 200, which may connect to the legs 204A-204D, may house various components of the robot 200. For example, the body 208 may include or carry sensor(s) 210. These sensors may be any of the sensors discussed in the context of sensor(s) 110, such as a camera, LIDAR, or an infrared sensor, but are not limited to those illustrated in FIG. 2. In addition, sensor(s) 210 may be positioned in various locations on the robot 200, such as on the body 208 and/or on one or more of the legs 204A-204D, among other examples.

Figure 3:
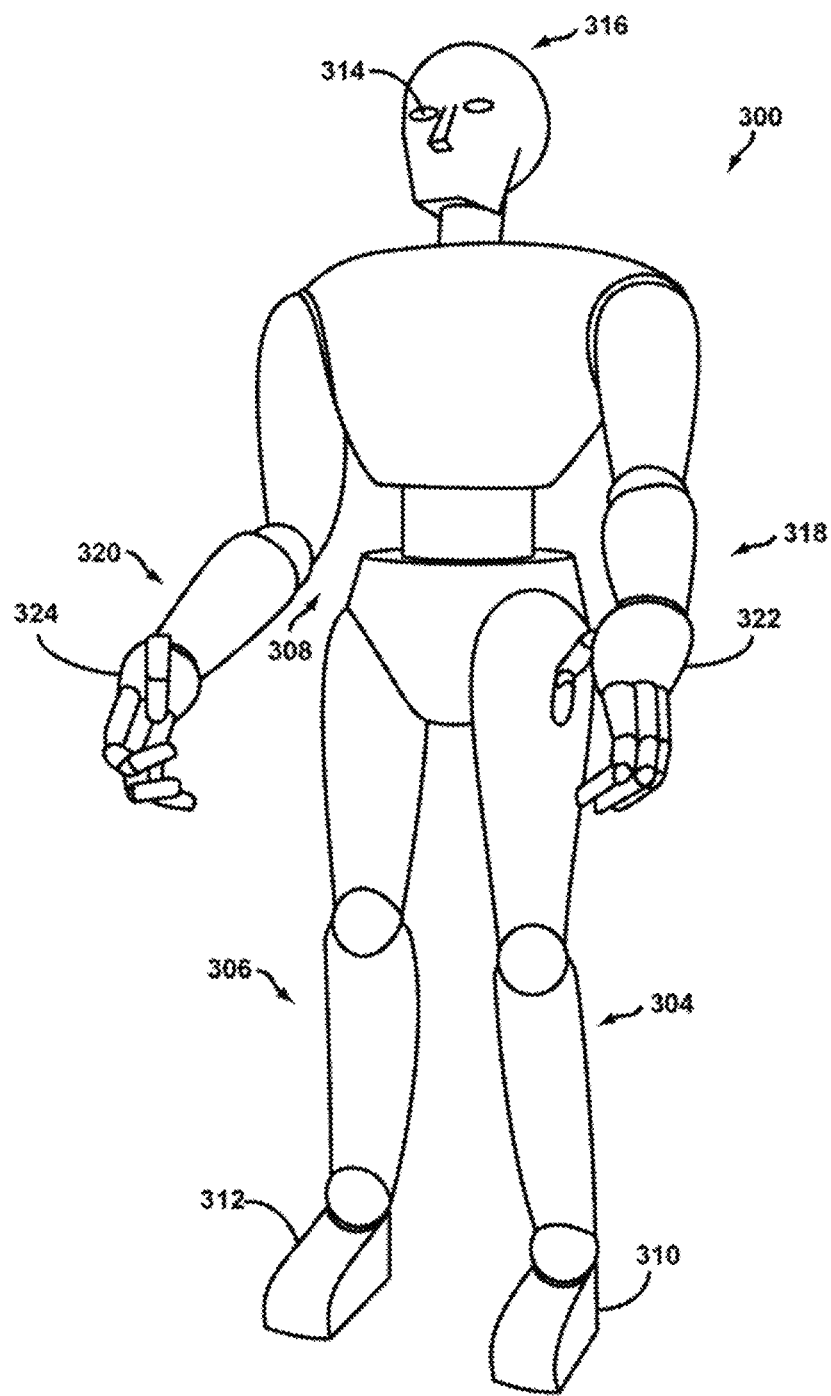
FIG. 3 illustrates a perspective view of a biped robot, according to an illustrative embodiment.

FIG. 3 illustrates a biped robot 300 according to another example implementation. Similar to robot 200, the robot 300 may correspond to the robotic system 100 shown in FIG. 1, and may be configured to perform some of the implementations described herein. Thus, like the robot 200, the robot 300 may include one or more of mechanical components 114, sensor(s) 110, power source(s) 112, electrical components 116, and/or controller 108.

For example, the robot 300 may include legs 304 and 306 connected to a body 308. Each leg may consist of one or more members connected by joints and configured to operate with various degrees of freedom with respect to one another. Each leg may also include a respective foot 310 and 312, which may contact a surface (e.g., a ground surface). Like the robot 200, the legs 304 and 306 may enable the robot 300 to travel at various speeds according to the mechanics set forth within gaits. The robot 300, however, may utilize different gaits from that of the robot 200, due at least in part to the differences between biped and quadruped capabilities.

The robot 300 may also include arms 318 and 320. These arms may facilitate certain functions for the robot 300, such as object manipulation, load carrying, and/or balancing. Like legs 304 and 306, each arm may consist of one or more members connected by joints and configured to operate with various degrees of freedom with respect to one another. Each arm may also include a respective hand 322 and 324. The robot 300 may use hands 322 and 324 for gripping, turning, pulling, and/or pushing objects. The hands 322 and 324 may include various types of appendages or attachments, such as fingers, grippers, welding tools, cutting tools, and so on.

The robot 300 may also include sensor(s) 314, corresponding to sensor(s) 110, and configured to provide sensor data to its control system. In some cases, the locations of these sensors may be chosen in order to suggest an anthropomorphic structure of the robot 300. Thus, as illustrated in FIG. 3, the robot 300 may contain vision sensors (e.g., cameras, infrared sensors, object sensors, range sensors, etc.) within its head 316.

Figure 4:
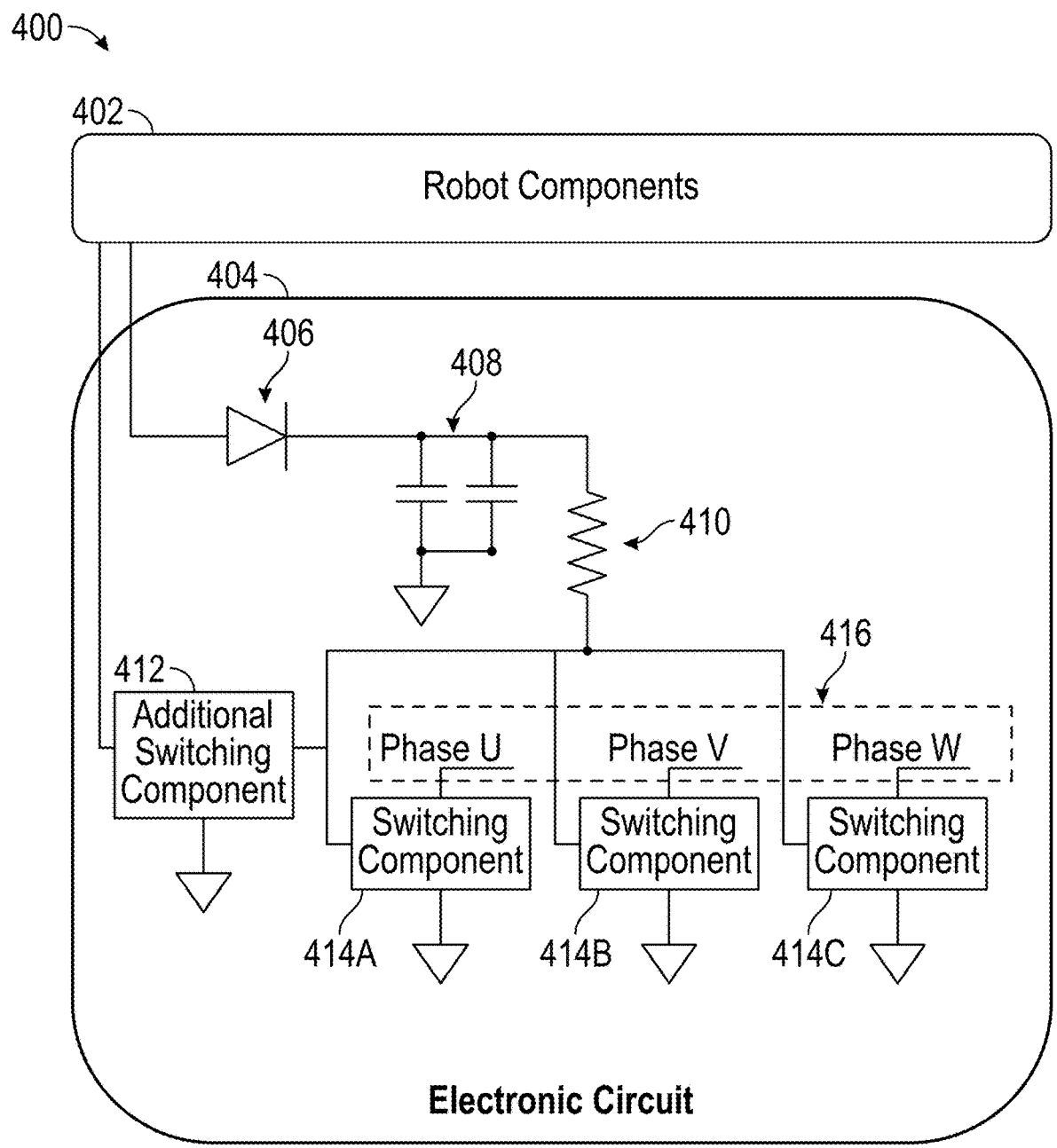
FIG. 4 illustrates an exemplary electronic circuit, according to an illustrative embodiment.

FIG. 4 illustrates an exemplary electronic circuit 404 of a robot 400, according to an illustrative embodiment. The electronic circuit 404 is in electronic communication with robot components 402 included in the robot 400. The robot components 402 may include electronic components (e.g., a primary power source such as a direct current battery) and/or other components (e.g., some or all of those shown and described above). During operation, current flows from the robot components 402 into the electronic circuit 404. The electronic circuit 404 can include a current flow regulating component 406 (e.g., a diode), a charge storing component 408 (e.g., a bank of one or more capacitors, or a battery), a resistor 410, a set of one or more switching components 414A, 414B, 414C (e.g., a set of n-channel MOSFETs), and an additional switching component 412 (e.g., a solid-state relay) coupled to the set of one or more switching components 414A, 414B, 414C. The set of one or more switching components 414A, 414B, 414C can be connected to the motor 416 at certain windings of the motor 416, e.g., windings associated with Phases U, V, and W, respectively, of the motor 416.

Some embodiments include a plurality of electronic circuits 404, each of which is electrically coupled to one or more robot components 402. For instance, each robot component 402 of robot 400 may be associated with a single electronic circuit 404 electrically coupled thereto, the electronic circuit 404 being configured to control slowing of a motor of the robot component 402, as described in more detail below. In other embodiments, multiple robot components 402 may be associated with a single electronic circuit 404 electrically coupled thereto. For example, the single electronic circuit 404 may be electrically coupled to a power bus to which each of multiple robot components 402 is also electrically coupled. In such a configuration the electronic circuit 404 electrically coupled to the power bus may be configured to simultaneously control slowing of motors of the multiple robot components 402 indirectly via the power bus. Any other suitable arrangement of electronic circuit(s) 404 and robot component(s) 402 may alternatively be used, including the use of a single electronic circuit 404 for the robot 400, and embodiments are not limited in this respect.

During operation, when the robot components 402 are providing power to the electronic circuit 404, the additional switching component 412 assumes a first state (e.g., closed or "on") that actively holds the switching components 414A, 414B, 414C in a state of being open (or "off" or in another state that results in the motor windings not being shorted). When the robot components 402 are not providing power to the electronic circuit 404 (e.g., in the event of a power loss or emergency stop), the additional switching component 412 assumes a second state (e.g., open or "off") that permits the switching components 414A, 414B, 414C to assume a state of being closed (or "on" or in a similar state that results in the motor windings being shorted). In some embodiments, this configuration occurs when current flowing to the additional switching component 412 falls below a threshold value. In this configuration, one or more of the windings of the motor 416 may be shorted at least in part because charge is allowed to flow from the charge storing component 408 (e.g., where charge has been stored during operation by the robot components 402 and/or motion of the motor 416) through the resistor 410 into the switching components 414A, 414B, 414C. When the winding(s) of the motor 416 are shorted, a drag torque is applied to the motor, which naturally slows down the rotation of the motor 416, causing it (and therefore any coupled actuator(s) and/or robot joint(s)) to slow down and come to rest gently over a period of time.

In some embodiments, a peak drag torque is reached, which determines how quickly the motor's rotation slows to zero. In some embodiments, the peak drag torque is between 0.1 and 0.5 Nm at the motor (which may be multiplied at a robot joint via, e.g., a gearbox configuration). In some embodiments, the motor's rotation comes to rest over a period of 2-6 seconds. In some embodiments, the motor windings are not shorted directly, but are shorted indirectly (e.g., a power bus feeding an inverter bridge coupled to the motor windings can be shorted directly and produce a similar result). In some embodiments, the additional switching component 412 is electrically connected to a microcontroller and/or other control device. In some embodiments, such a device can also enable and/or disable braking without a full loss of power and/or undermining the function of robot component 402 when power is lost. For example, a "transportation mode" can be enabled on the robot, wherein the robot legs are generally held in place without the safety risk of enabling the motors. Alternatively or in addition, a "holding mode" can be enabled on the robot, wherein the robot is powered down (e.g., to prevent sliding down stairs).

Figure 5:
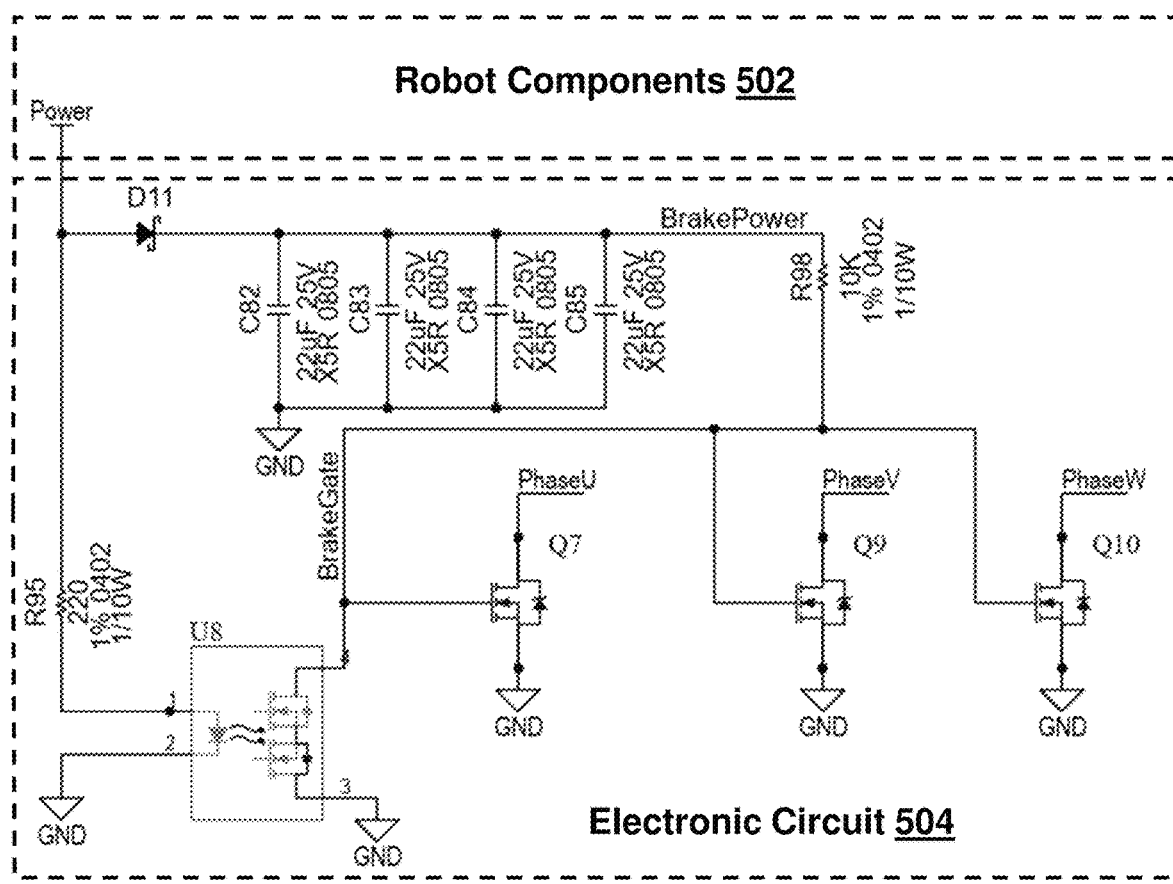
FIG. 5 illustrates another exemplary electronic circuit, according to an illustrative embodiment.

FIG. 5 illustrates another exemplary electronic circuit 504, according to an illustrative embodiment. The electronic circuit 504 is in electronic communication with one or more robot components 502 included in the robot 500. Generally, the components shown and described in FIG. 5 can be arranged similarly to the ones shown and described in FIG. 4 and can provide similar functions. However, FIG. 5 displays certain additional details of one specific implementation.

For example, in FIG. 5, the component designated U8 (which can be a solid-state relay) functions as the additional switching component, while the components designated Q7, Q9 and Q10 (which can be FETs, such as N-channel MOSFETs), which are all connected to pin 4 of the additional switching component, function as the set of switching components. When current flows from pin 1 to pin 2 in U8, pins 3 and 4 are shorted, which forces the switching components Q7, Q9 and Q10 to switch to an off state. Thus, the electronic circuit 504 is kept off while it is receiving power from the robot components 502. However, when power from the robot components 502 is lost, U8 releases the gates of the switching components Q7, Q9 and Q10, which allows them to switch to an on state. As a result, current flows through the resistor R98 into the circuitry labeled "BrakeGate," switching on the switching components Q7, Q9, and Q10. Since the switching components Q7, Q9 and Q10 are attached to the windings of the robot motor (at Phases U, V, and W as shown), the motor is thus shorted, and a drag torque is applied to the motor (e.g., as described above), causing damping of the motor motion.

Although FIG. 5 shows certain specific components, other components may be chosen as well. As one non-limiting example, although four 22-microfarad capacitors arranged in parallel are shown as the charge storing component, in some embodiments another number of capacitor(s) or size of capacitor(s) can be selected as well (which may result in a greater or lower runtime). As another non-limiting example, in some embodiments, the N-channel MOSFETs may be replaced by other components, e.g., different FETs or other transistors. In some embodiments, additional components can be added to the BrakeGate circuitry, e.g., resistors, capacitors, diodes, additional switches, or other electronic components. In some embodiments, the primary power bus can be shorted instead of directly shorting the motor windings. In some embodiments, a 12V power source can be used. In some embodiments, another power source can be chosen (e.g., another direct current source with a different potential) that does not cause the voltage range of the N-channel MOSFETs to be violated. In some embodiments, a resistor can be added in series between each MOSFET and each motor winding (e.g., one between Q7 and Phase U, one between Q9 and Phase V, and one between Q10 and Phase W), e.g., to decrease the damping force that arises as described above.

FIG. 6 is a flowchart of an exemplary method, according to an illustrative embodiment. In a first act 602, electric charge is stored in a charge storing component of an electronic circuit. The charge storing component is coupled to a current flow regulating component and a set of one or more switching components. In a second act 604, an additional switching component is operated in a first state or a second state based on a current or a voltage received by the additional switching component. The first state prevents current to flow from the charge storing component to each switching component in the set of one or more switching components and the second state allows current to flow from the charge storing component to each of the one or more switching components in the set. When the additional switching component is in the second state, motor windings attached to the set of one or more switching components may be shorted, causing the effects described above (e.g., in contrast to when the additional switching component is in the first state and current flows from the charge storing component to ground via the additional switching component).

Figure 7:
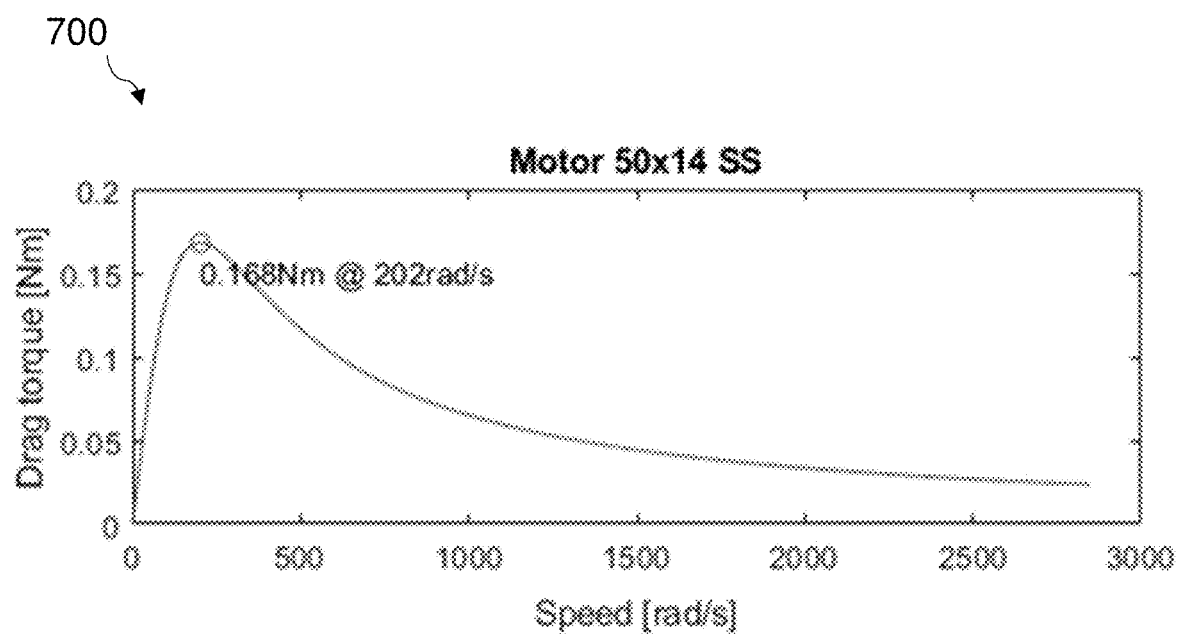
FIG. 7 shows a plot of motor braking torque versus rotational speed for a simulation for a motor operably connected to a robot joint, according to an illustrative embodiment.
Figure 8:
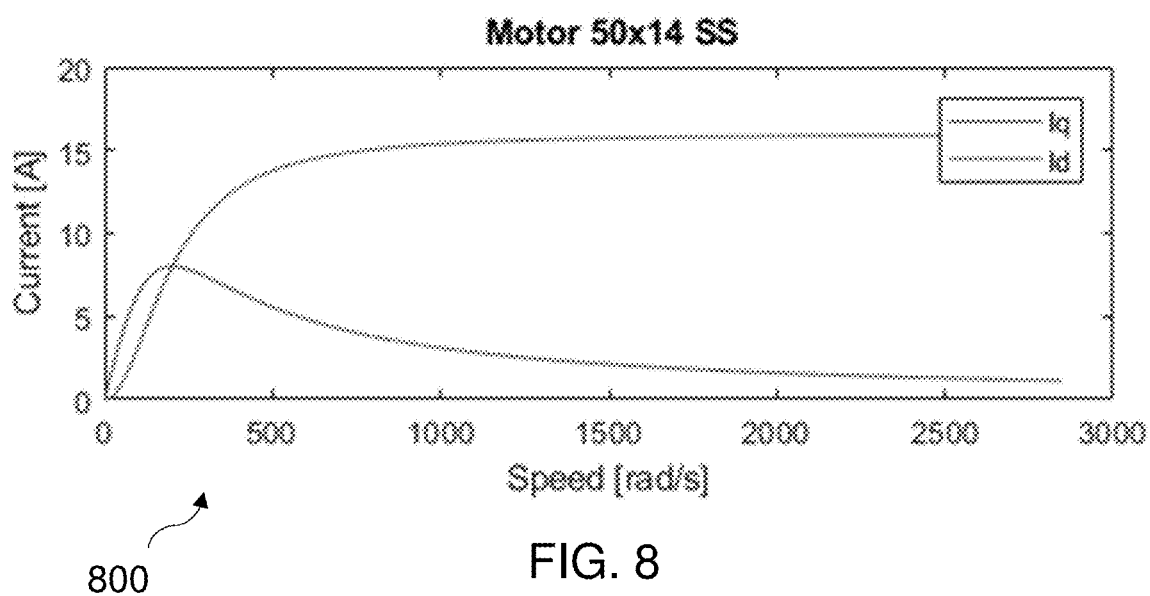
FIG. 8 shows a plot of motor torque current and back EMF current versus rotational speed for the simulation of FIG. 7, according to an illustrative embodiment.

FIG. 7 shows a plot 700 of motor braking torque in Newton-meters versus rotational speed of the motor in radians per second for a simulation for a motor operably connected to a robot joint, according to an illustrative embodiment. The simulation was conducted using a 50×14 SS motor. As illustrated, a peak drag torque of 0.168 Nm was achieved at an angular speed of 202 radians per second, which was 52.5% of saturation torque. FIG. 8 shows a plot 800 of motor torque current and back EMF current in Amps versus motor speed in radians per second for the simulation of FIG. 7, according to an illustrative embodiment. On this plot, Iq (motor torque current) and Id (motor back EMF current) are shown as functions of motor speed. As shown, the point at which Iq equals Id corresponds to the point at which the peak drag torque shown above in FIG. 7 is obtained.

A number of implementations have been described. Nevertheless, it will be understood that various modifications may be made without departing from the spirit and scope of the disclosure.

What is claimed is:
1. An electronic circuit comprising:
a charge storing component configured to be charged by a power source;
a set of one or more switching components coupled to the charge storing component; and
an additional switching component coupled to each of the one or more switching components in the set,
wherein the additional switching component is configured to operate in a first state when the power source is providing power and in a second state when the power source is not providing power, the additional switching component configured to receive a current from the charge storing component in the first state to prevent the current to flow from the charge storing component to each of the one or more switching components in the set, and the second state allowing the current to flow from the charge storing component to each of the one or more switching components in the set.

2. The electronic circuit of claim 1, further comprising a current flow regulating component coupled to the charge storing component.

3. The electronic circuit of claim 2, further comprising a motor having a plurality of motor windings, each switching component in the set of one or more switching components coupled to a distinct motor winding in the plurality of motor windings.

4. The electronic circuit of claim 3, wherein when the additional switching component is in the second state, each distinct motor winding in the plurality of motor windings is shorted.

5. The electronic circuit of claim 3, wherein the motor is operably connected to a robot joint.

6. The electronic circuit of claim 1, wherein the charge storing component includes one or more capacitors.

7. The electronic circuit of claim 1, wherein the charge storing component includes a battery.

8. The electronic circuit of claim 2, wherein the current flow regulating component includes a diode.

9. The electronic circuit of claim 2, further comprising a resistor coupled to the charge storing component, the resistor located between the charge storing component and the set of one or more switching components.

10. The electronic circuit of claim 1, wherein the additional switching component includes a solid-state relay.

11. The electronic circuit of claim 1, wherein the set of one or more switching components includes one or more MOSFETs.

12. The electronic circuit of claim 1, wherein during operation, when the power source is providing power to the circuit, each switching component in the set of switching components is open and the additional switching component is closed, and when the power source is not providing power to the circuit, each switching component in the set of switching components is closed and the additional switching component is open.

13. The electronic circuit of claim 1, wherein the additional switching component is configured to:
determine that the circuit has lost power from the power source; and
passively provide power from the charge storing component to the set of one or more switching components in response to determining that the circuit has lost power from the power source.

14. A method comprising:
storing electric charge from a power source in a charge storing component of an electronic circuit, the charge storing component coupled to a current flow regulating component and a set of one or more switching components; and
operating an additional switching component in a first state when the power source is providing power and in a second state when the power source is not providing power, the additional switching component receiving a current from the charge storing component in the first state to prevent the current to flow from the charge storing component to each switching component in the set of one or more switching components, and the second state allowing the current to flow from the charge storing component to each of the one or more switching components in the set.

15. The method of claim 14, wherein each switching component in the set of one or more switching components is coupled to a distinct motor winding of a motor having a plurality of motor windings.

16. The method of claim 15, wherein when the additional switching component is in the second state, each motor winding in the plurality of motor windings is shorted.

17. The method of claim 15, wherein the motor is operably connected to a robot joint.

18. The method of claim 14, wherein during operation, when the power source is providing power to the circuit, each switching component in the set of switching components is open and the additional switching component is closed, and when the power source is not providing power to the electronic circuit, each switching component in the set of switching components is closed and the additional switching component is open.

19. The method of claim 14, further comprising:
determining, by the additional switching circuit that the electronic circuit has lost power from the power source; and
switching the additional switching component from the first state to the second state in response to determining that the electronic circuit has lost power from the power source.

20. A mobile robot, comprising:
a plurality of robot joints, each being associated with a motor; and
at least one electronic circuit coupled to each of the plurality of robot joints, wherein the at least one electronic circuit comprises:
a charge storing component configured to be charged by a power source;
a set of one or more switching components coupled to the charge storing component, the set of one or more switching components being further coupled to the motor of at least one of the plurality of robot joints; and
an additional switching component coupled to each of the one or more switching components in the set,
wherein the additional switching component is configured to operate in a first state when the power source is providing power and in a second state when the power source is not providing power, the additional switching component configured to receive a current from the charge storing component in the first state to prevent the current to flow from the charge storing component to each of the one or more switching components in the set, and the second state allowing the current to flow from the charge storing component to each of the one or more switching components in the set.

21. The mobile robot of claim 20, wherein
the power source is configured to provide power to one or more of the plurality of robot joints,
wherein the set of one or more switching components is coupled to the motor of the at least one of the plurality or robot joints via the power source.

22. The mobile robot of claim 20, wherein the at least one electronic circuit further comprises:
a current flow regulating component coupled to the charge storing component; and
a resistor coupled between the charge storing component and the set of one or more switching components.

* * * * *